United States Patent [19]

Crumbaker

[11] Patent Number: 5,582,649
[45] Date of Patent: Dec. 10, 1996

[54] WAFER TRANSFER APPARATUS FOR USE IN A FILM DEPOSITION FURNACE

[75] Inventor: Todd E. Crumbaker, N. Billerica, Mass.

[73] Assignee: The United States of America as represented by the Secretary of the Air Force, Washington, D.C.

[21] Appl. No.: 608,806

[22] Filed: Feb. 29, 1996

[51] Int. Cl.⁶ .................................................. C23C 16/00
[52] U.S. Cl. .................... 118/724; 118/718; 118/500; 118/50; 414/940; 414/156; 414/198; 432/253
[58] Field of Search ...................... 118/715, 724, 118/728, 729, 500, 50; 414/940, 156, 198; 432/5, 6, 152, 253

[56] References Cited

U.S. PATENT DOCUMENTS

| | | | |
|---|---|---|---|
| 3,819,067 | 6/1974 | Hammond | 214/26 |
| 4,129,090 | 12/1978 | Inaniwa | 118/49 |
| 4,287,851 | 9/1981 | Dozier | 118/723 |
| 4,439,146 | 3/1984 | Sugita | 432/253 |
| 4,487,161 | 12/1984 | Hirata | 118/723 |
| 4,793,283 | 12/1988 | Sarkozy | 118/725 |

FOREIGN PATENT DOCUMENTS

| | | | |
|---|---|---|---|
| 3829159A1 | 3/1990 | Germany | 414/940 |
| 54-125975 | 9/1979 | Japan | 118/500 |
| 55-85014 | 6/1980 | Japan | 118/729 |
| 55-98826 | 7/1980 | Japan | 118/500 |
| 58-102527 | 6/1983 | Japan | 118/728 |
| 58-218115 | 12/1983 | Japan | . |
| 60-53032 | 3/1985 | Japan | 118/728 |
| 62-16518 | 1/1987 | Japan | 118/728 |
| 63-36524 | 2/1988 | Japan | 118/728 |
| 4-155821 | 5/1992 | Japan | 118/724 |

OTHER PUBLICATIONS

R. M. Defries, Wafer Carrier, IBM Technical Disclosure Bulletin vol. 11, No. 12, 1685–1686.
A. M. Lowen, Design for a Quartz Boat to Process Ceramic Substrates, IBM Technical Disclosure Bulletin vol. 24 No. 6, 2967–2968.

*Primary Examiner*—Robert Kunemund
*Assistant Examiner*—Jeffrie R. Lund
*Attorney, Agent, or Firm*—Robert L. Nathans; Stanton E. Collier

[57] ABSTRACT

A boat, carrying wafers to be processed, is pushed into a furnace by a substantially elongated and cantilevered actuator arm having a lug that pushes by first rotating the arm, to cause the lug to traverse a vertical rod attached to against a plate affixed to the boat. The boat is later pulled out of the furnace the boat, and thereafter pulling on the arm to enable the lug to pull against the vertical rod to withdraw the boat. Reliable operation is attained regardless of sagging of the actuator arm relative to the boat.

7 Claims, 1 Drawing Sheet

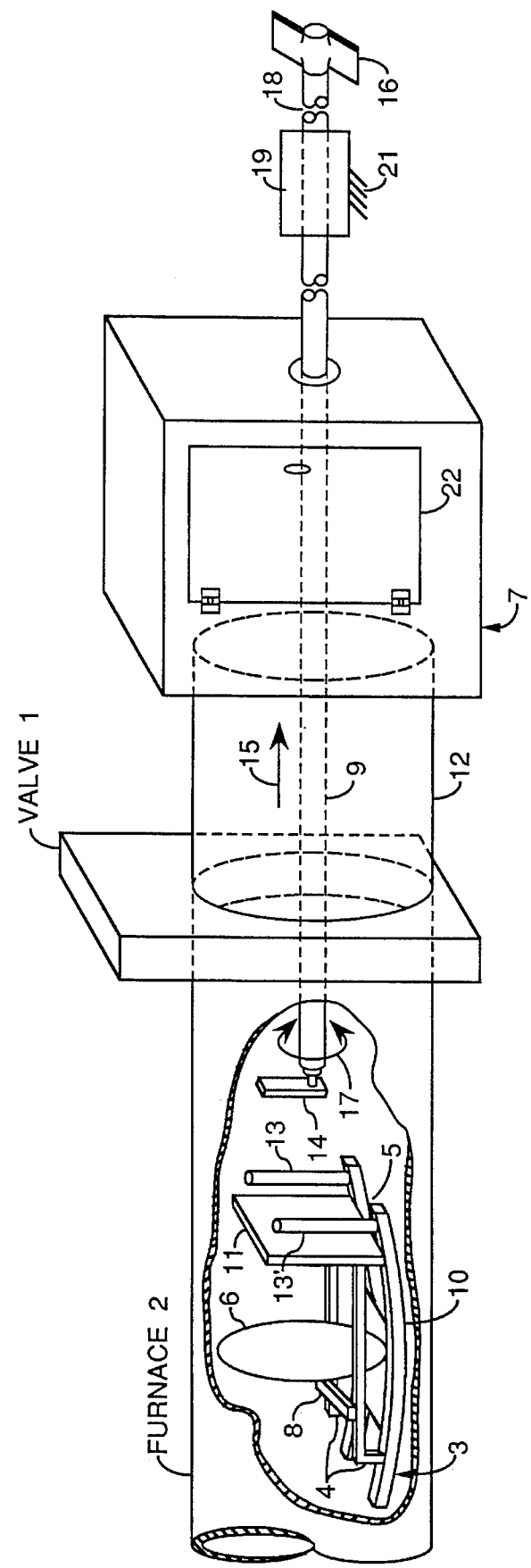

5,582,649

WAFER TRANSFER APPARATUS FOR USE IN A FILM DEPOSITION FURNACE

STATEMENT OF GOVERNMENT INTEREST

The invention described herein may be manufactured and used by or for the Government for governmental purposes without the payment of any royalty thereon.

BACKGROUND OF THE INVENTION

In film vapor deposition processes, it is known to load a furnace tube under vacuum by employing a transfer mechanism for pushing a boat containing a number of semiconductor wafers to be coated with film into the furnace, and upon completion of the deposition of film on the wafers, the boat is pulled out of the furnace to retrieve the coated wafers. This situation is significantly more complicated if the furnace tube and the boat transfer mechanism are under high vacuum. In this case the transfer mechanism cannot be easily adjusted during operation because of the restriction of movement imposed by the required vacuum feedthrough.

The boat transfer arm has a length of several feet, e.g. four, to accommodate the extent of travel required upon inserting and removing the boat with respect to the furnace. Typically, the transfer arm is coupled to the wafer boat by an "L" shaped terminal arm portion, which fits into a hole in a horizontal boat plate extending from an end of the boat. The boat is transported in and out of the furnace by pushing and pulling on the transfer arm manually. However, displacement of the transfer arm from a horizontal plane could produce force vectors perpendicular to the length of the boat, subjecting the boat to tipping or jamming. Even if the transfer arm is maintained in the horizontal plane by a support, the arm would still be subjected to sagging due to the effect of gravity on the elongated and now cantilevered four foot arm. Hence, if this sagging of the long transfer arm is not somehow dealt with, the "L" shaped terminal arm portion can still push down on the boat to cause detrimental tipping and possible jamming of the boat with respect to the furnace supporting floor. Thus, a simple and reliable boat transfer mechanism is desired for eliminating this problem.

BRIEF SUMMARY OF THE INVENTION

In accordance with a preferred embodiment of the invention, the wafer boat has a vertical pusher plate and a pair of vertical rods affixed to a terminal boat portion. A substantially elongated and horizontally maintained boat actuator arm is slidably and rotatably coupled to an arm support member, and a lug is affixed to a terminal arm portion for engaging the boat. When the arm is pushed toward the center of the furnace, the vertically oriented lug pushes against the pusher plate to move the boat well into the furnace. After processing, and just before removal of the boat from the furnace, the actuator arm is rotated, causing the lug to be turned away from the vertical, to traverse one of the pair of vertical rods affixed to the boat, and pulling on the actuator arm now causes the lug to pull the boat out of the furnace.

BRIEF SUMMARY OF THE DRAWING

Other features and advantages of the invention will become more apparent upon reading the following description, taken in conjunction with the sole figure that illustrates a preferred embodiment of the invention.

DETAILED DESCRIPTION

As schematically shown in the sole figure, an conventional vacuum furnace 2, in the form of a heated hollow quartz tube or cylinder, is coupled to a vacuum valve 1, positioned between the furnace tube and a vestibule chamber 12, in turn coupled to a conventional vacuum load lock 7. The furnace tube, heating devices, vacuum valve and interlock are conventional, and thus are not shown in detail. Boat 3, shown well into the furnace tube, is initially manually positioned on the floor of the vestibule chamber 12 by the operator who opens door 22 and reaches to the left to deposit the boat within chamber 12.

Boat 3 includes a pair of rail members 4 that support disk-like semiconductor wafers 6, to be coated with semiconductor films produced by conventional vapor deposition processing steps carried out within the vacuum chamber. Rails 4 are coupled to sled runners 10 of the boat via a crosspiece 8. The boat is propelled into the furnace tube 2, by elongated rod 9, as explained below. Valve 1 is thereafter closed and the vacuum furnace tube, still under high vacuum, is ready for the deposition process.

A first boat driver means is affixed to a terminal portion 5 of boat 3, and consists of a vertical flat plate 11. A second boat driver means consists of a pair of vertically oriented rod members 13 and 13'. A support means, which could take numerous forms, and is shown as a hollow cylinder 19, to the right of the figure, and mechanically grounded at 21, rotatably and slidably supports a substantially elongated boat actuating rod member, which is maintained in a horizontal plane by hollow cylinder 19. The actuating member is a solid rod 9 having a length of several feet and is cantilevered by hollow cylinder 19, and is thus unsupported as it passes through load lock section 7, chamber 12, and the tube furnace 2.

When the furnace is loaded with wafers to be processed, and the boat is to be pushed to the left, the operator rotates rod 9 by means of handle 16 so that lug 14, affixed to the end of rod 9, is vertical and parallel with respect to members 13 and 13', thus enabling the lug to pass between the vertical rod-like members 13 and 13' as the operator pushes on the rod, to cause the lug to contact vertical flat plate 11. The operator continues to advance rod 9, and lug 14, pushing against the plate, causes boat 3 to be displaced to the left until it reaches the desired centralized position within the furnace. The arm now extends several feet into the furnace and is cantilevered. Note the break in the rod at 18, which indicates that the rod is much longer than illustrated.

After the films are deposited on wafers 6 as previously mentioned, vacuum valve 1 is opened, and the operator rotates rod 9 in either angular direction indicated by double headed arrow 17, until lug 14 traverses either member 13 or 13'. The operator then pulls on the rod via handle 16, as indicated by arrow 15, and the boat is thus retracted or pulled to the right, during its removal from the furnace. Only one of the vertical members 13, straddling rod 9, is required to engage the horizontally oriented lug. The use of two of such members however relieves the operator from rotating the rod 9 in the wrong direction such that the lug makes no contact with the boat at all. When the boat is again positioned in chamber 12, it is removed by the operator via door 22.

It may now be appreciated, that in contrast with the previously mentioned prior art approach of moving the boat, any gravity induced substantial sag of the elongated cantilevered boat actuating rod, due to its length of several feet extending from support 19, will not produce undesirable tipping of the boat. Such sagging of rod 9 will merely cause downward displacement of the flat lug 14 in the vertical direction with respect to the flat "pusher" plate and the "puller" members 13 and 13', and thus tipping is thwarted. Since other embodiments of the invention will readily occur to skilled workers in the art, the scope of the invention is to be limited solely by the terms of the following claims and equivalents and obvious variations thereof.

What is claimed is:

1. Vacuum chamber processing apparatus comprising:
   (a) a vacuum chamber for processing articles positioned upon a movable boat horizontally supported within said vacuum chamber;
   (b) support means for rotatably and slidably supporting in a horizontal plane substantially elongated boat actuator member having a lug projecting therefrom;
   (c) first boat driver means affixed to said boat for enabling the lug to push against said first boat driver means to advance said boat; and
   (d) second boat driver means affixed to said boat for enabling said lug to pull the boat out of said vacuum chamber.

2. The apparatus of claim 1 wherein said substantially elongated boat actuator member has a length of at least several feet.

3. The apparatus of claim 1 or 2 wherein said first boat driver means comprises a vertical plate and said second boat driver means comprises at least one vertical member for engaging the lug affixed to said substantially elongated boat actuator member.

4. The apparatus of claim 3 wherein said second boat driver means includes a pair of vertically oriented members straddling said substantially elongated boat actuator member, thereby to facilitate coupling of the substantially elongated boat actuator member to the boat.

5. Vacuum chamber processing apparatus comprising:
   (a) a vacuum chamber for processing articles;
   (b) a movable boat for supporting the articles within the vacuum chamber;
   (c) an elongated boat actuator member having a length of several feet;
   (d) a lug extending at right angles from a terminal portion of said boat actuator member;
   (e) support means for rotatably and slidably supporting in cantilevered fashion said elongated boat actuator member in a horizontal plane;
   (f) first boat driver means affixed to said boat for enabling said lug to push against said first boat driver means upon advancement of said elongated boat actuator member, thereby to push the boat within the vacuum chamber; and
   (g) second boat driver means affixed to said boat for enabling said lug to pull the boat out of said vacuum chamber upon retraction of said elongated boat actuator member.

6. The apparatus of claim 5 wherein said first boat driver means comprises a vertical plate and said second boat driver means comprises at least one vertical member for engaging the lug affixed to said elongated boat actuator member.

7. The apparatus of claim 6 wherein said second boat driver means includes a pair of vertically oriented members straddling said elongated boat actuator member, thereby to facilitate the coupling of the elongated boat actuator member to the boat.

* * * * *